United States Patent [19]

Lockwood et al.

[11] 4,090,056

[45] May 16, 1978

[54] OPTICAL VIEWING SYSTEM FOR AN ELECTRON BEAM WELDER

[75] Inventors: Herbert C. Lockwood, Chino; Salvatore M. Robelotto, Torrance, both of Calif.

[73] Assignee: Electron Beam Welding, Inc., Los Angeles, Calif.

[21] Appl. No.: 687,163

[22] Filed: May 17, 1976

[51] Int. Cl.$^2$ ............................................. B23K 9/00
[52] U.S. Cl. ............................ 219/121 EB; 165/185; 350/61
[58] Field of Search ..... 219/121 EB, 121 L, 121 LM; 165/185; 350/61

[56] References Cited

U.S. PATENT DOCUMENTS

| | | | |
|---|---|---|---|
| 3,156,810 | 11/1964 | Samuelson | 219/121 EB |
| 3,571,554 | 3/1971 | Baujoin et al. | 350/61 |

Primary Examiner—J. V. Truhe
Assistant Examiner—Fred E. Bell
Attorney, Agent, or Firm—Christie, Parker & Hale

[57] ABSTRACT

An electron beam welding device having a vacuum chamber in which an electron gun directs a beam of electrons at a work piece, wherein the optical system for viewing the point of impact of the beam with the work piece includes a light reflecting element in the form of a prism. The prism is positioned in the vacuum chamber to one side and closely adjacent the path of the electron beam and has a first surface extending substantially perpendicular to the beam. This surface is protected by a strip of transparent plastic material having a portion extending across the surface of the prism, the strip being movable to permit the portion to be continuously replaced as it becomes clouded. An open mesh conductive screen is positioned between the impact area and the strip to at least partially screen the material from infrared and X-ray radiation, otherwise acts to rapidly reduce the transparency of the strip.

8 Claims, 4 Drawing Figures

OPTICAL VIEWING SYSTEM FOR AN ELECTRON BEAM WELDER

FIELD OF THE INVENTION

This invention relates to electron beam welders, and more particularly, to means for shielding the optical viewing system from vapors and radiations which otherwise reduce visibility.

BACKGROUND OF THE INVENTION

The use of high energy electron beams to effect welding of metal is well known. The welding process must take place in a high vacuum in order to generate an electron beam of high kinetic energy. The high energy beam impinges on the joint between the metals being welded together, the energy of the beam causing the metals to melt and fuse together.

Because the welding process must be carried out in a high vacuum, some optical arrangement is generally required to permit the operator to view the work piece within the vacuum chamber. Whatever optical arrangement is used, by transmitting light from the impact area, is necessarily exposed to other wave lengths of energy from the impact area, such as infrared and X-ray radiations, but also is exposed to atomic vapor of the materials being welded which deposit on surfaces of the optical system and cause it to become opaque. These deposits must be removed frequently, which requires opening the chamber to atmosphere and substantially reducing the operating time and efficiency of the welding device.

In U.S. Pat. No. 3,156,810 there in described a viewing system for an electron beam welder in which a transparent strip of electrically conductive material is movable across the surface of the optical system exposed to the metallic vapors. This strip can be advanced as vapor deposits accumulate on the surface of the strip so as to clear the optical system of deposited materials.

However, the transparent strip of plastic materials is exposed to infrared and X-ray radiations generated by the impact of the electron beam with the work piece, producing destructive heating and discoloration of the plastic material and possible damage to the glass of the reflecting element. Also, static charges tend to build up on the plastic strip which can influence the focusing of the electron beam. The above-identified patent suggests using a plastic material having a conductive surface to dissipate the electric charge and to use a metal mirror rather than a glass-reflecting element to lessen the effect of X-rays. However, the rate of clouding and discoloration due to radiations from the impact area greatly increases the frequency at which the strip must be advanced and replaced, and the addition of the conductive coating on the plastic strip increases its cost.

SUMMARY OF THE INVENTION

The present invention is directed to an improved arrangement for protecting the optical system from vapor deposition and the effects of radiations other than light, such as infrared and X-rays, as well as against accumulating electrical charge. This is accomplished, in brief, by providing an optical viewing system for an electron beam welder which utilizes a prism positioned adjacent the beam to receive light from the impact area and direct it outwardly at an angle away from the electron beam for viewing outside of the vacuum chamber. The incident light receiving surface of the prism is protected by a strip of plastic material movable past the surface so that the portion immediately in front of the surface can be replaced from time to time by advancing the strip. An open mesh wire screen of conductive material is interposed between the impact area and the plastic strip to partially shield the strip from infrared and X-ray radiation from the impact area. The screen is conductively mounted to dissipate any electrical charge which would otherwise tend to accumulate on the plastic strip and to conduct heat away from the screen produced by the impinging infrared radiation.

DESCRIPTION OF THE DRAWINGS

For a better understanding of the invention reference should be made to the accompanying drawing, therein.

DETAILED DESCRIPTION

Figure 1:
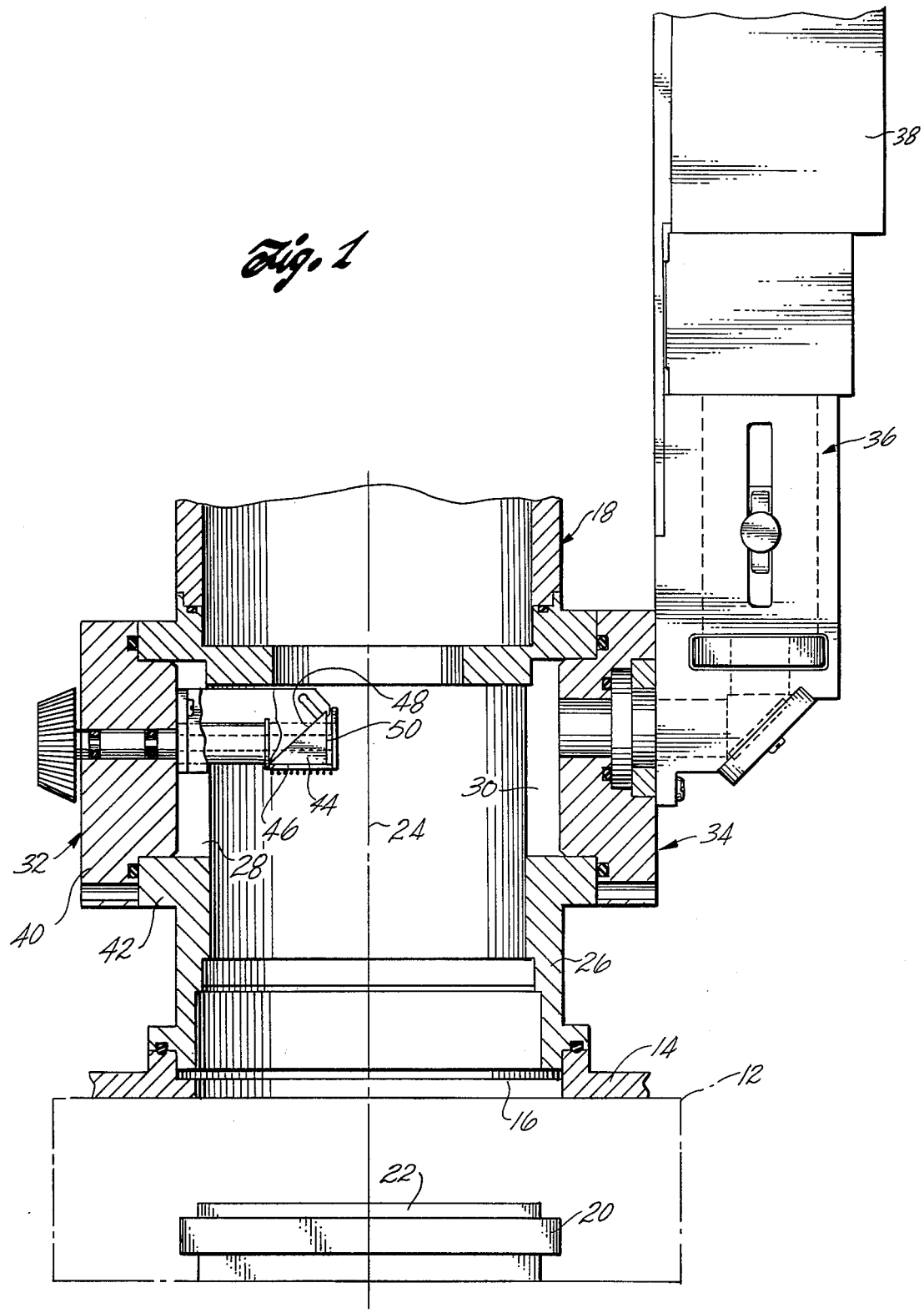
FIG. 1 is a cross-sectional view of the electron gun and optical viewing assembly of an electron beam welding device.

Referring to the drawings in detail, the numeral 10 indicates generally an electron beam welding assembly which includes a vacuum chamber indicated schematically at 12. The chamber 12 has a top well 14 including an opening 16 on top of which is mounted an electron gun assembly, indicated generally at 18. The vacuum chamber 12 may be any type of enclosed air-tight box having a suitable sealed door (not shown) to provide access to the interior of the vacuum chamber. A horizontal work table 20 is provided in the chamber on which may be supported a work peice, such as indicated at 22, which is to be welded. The work table 20 may be movable in a horizontal plane in any direction by suitable external controls (not shown) by which the work piece 22 is moved relative to the electron beam directed vertically downwardly from the electron gun assembly 18. The vacuum chamber 12 is connected to vacuum pump equipment for producing a high vacuum within the chamber.

The gun assembly is of conventional design for generating and focusing a high energy electron beam downwardly along a vertical axis 24 through the opening 16. The electron gun assembly 18 includes an outer cylindrical wall 26 which is mounted at the lower end thereof in sealed relationship to the top wall 14 of the chamber 12. A pair of integral flanged ports 28 and 30 are provided on either side of the cylindrical wall 26, the ports being aligned along a common axis extending perpendicular to the axis 24 of the electron beam.

A mirror assembly, indicated generally at 32, is removably mounted in the port 28 and is arranged to direct light passing upwardly from the impact of the electron beam with the work piece 22 in the direction of the electron beam out through the flanged port 30. A viewing assembly, indicated generally at 34, is mounted in the port 30, the viewing assembly 34 preferably including a video camera 36 for receiving the light and forming an image on a video monitor (not shown) of the impact area.

Figure 2:
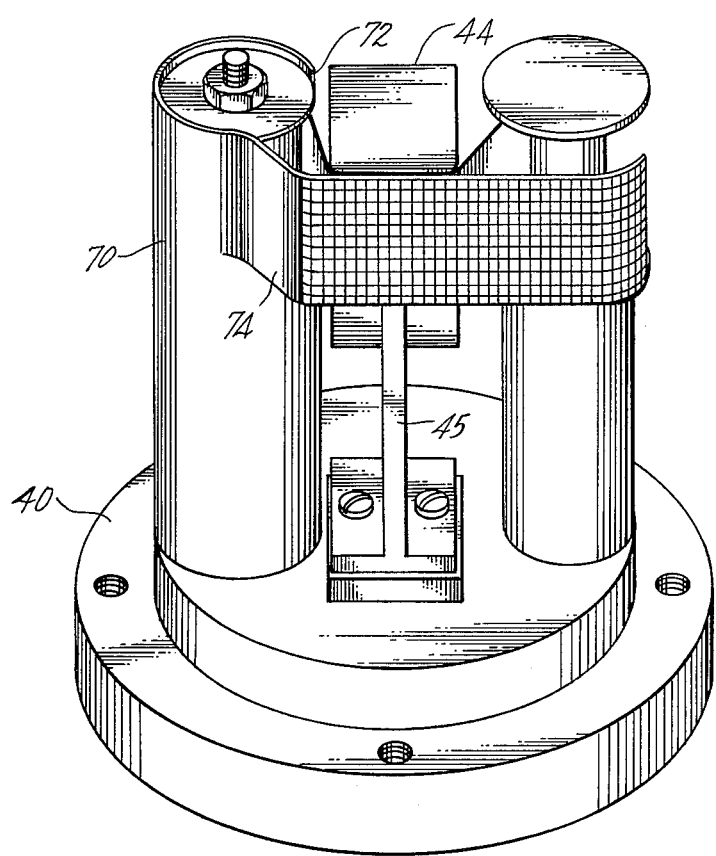
FIG. 2 is a perspective view of the optical assembly.
Figure 4:
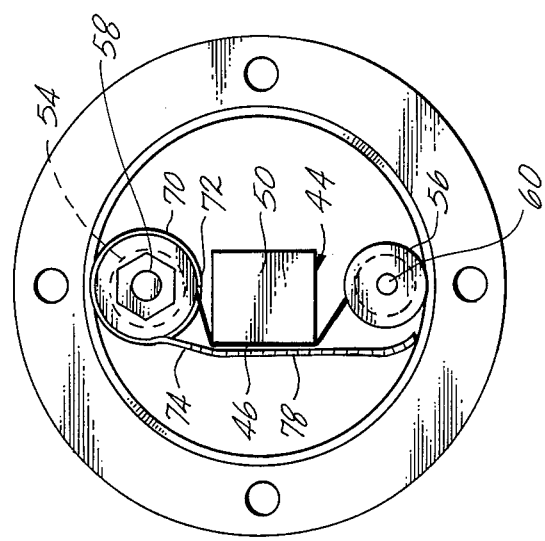
FIG. 4 is an end view of the optical assembly of FIG. 2.
Figure 3:
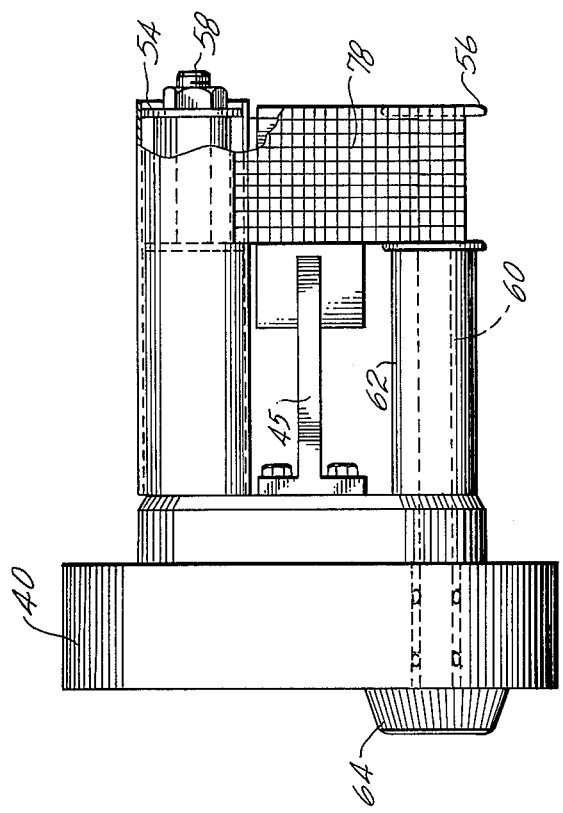
FIG. 3 is a bottom view partly in section of the optical portion of FIG. 2.

The optical assembly is shown in detail in FIGS. 2, 3, and 4. The assembly 32 includes a circular base plate 40 which is bolted or otherwise secured in sealed relation to the flange 42 extending around the port 28. An optical prism 44 is supported on the inside of the base plate 40 by a suitable mounting bracket 45. The bracket 45 supports the prism from the plate 40 with a first surface 46 extending in a plane substantially perpendicular to the axis 24 of the electron beam. Light from the impact area of the work piece 22 incident on the surface 46 enters the prism and is reflected by a back surface 48 out through a second surface 50 extending substantially perpendicular to the surface 46. Thus the light is directed to the port 30 where it enters the viewing assembly 34 and is focused on the video camera 36.

The present invention is directed specifically to an arrangement for protecting the surface 46 of the prism 44 from deposition of the vaporized material emanating from the point of impact in the electron beam and the work piece. To this end a pair of spools 54 and 56 are arranged to respectively supply and take up a strip of transparent plastic material 58, such as Mylar film. The spools are positioned on either side of the prism 44 so that the transparent strip of plastic passes over the surface 46 in passing between the spools. The supply spool is journaled for rotation on a stub shaft 60. One end of the stub shaft 60 is secured to the base plate 40 and is of slightly larger diameter than the rim of the spool 54. The other end is of smaller diameter to receive the spool for rotation. The take-up spool 56 is secured on the outer end of a shaft 60 which is journaled in a bushing 62 projecting from the base plate 40. The shaft 60 extends through a seal in the base plate 40 to a knob 64 projecting from the outer surface of the plate 40. Rotation of the knob 64 causes rotation of the take-up spool 56 so as to advance the plastic strip past the prism surface 46. Thus as vapors deposit out on the surface of the plastic strip, the clouded portion of the strip can be advanced to the take-up reel 56 and a fresh clear section of the strip moved in front of the prism surface.

A tubular metal shroud 70 split along one side at 72 fits over the lower end stub shaft 66 and extends up around the supply spool 54, thus completely shielding the spool 54. The plastic strip passes out through the split 72 in going from the spool to the prism 44 and spool 56. This portion of the plastic strip is shielded by a metal plate 74 which is integral with the shroud 70. The plate 74 is slightly wider than the plastic strip and extends to a point adjacent one edge of the prism surface 46. Secured to the outer edge of the plate 14 is a metal open-mesh screen 78 which extends across the face 46 of the prism. The screen 78 is spaced from the prism face to permit the plastic strip to pass between the prism and the screen. The screen 78, being out of the focal plane of the optical system has the effect of only slightly reducing the quantity of light transmitted to the video camera. However, the screen does act to shield the plastic strip and prism to a significant degree from infrared radiation, the metal sreen conducting heat produced by the infrared radiation away from the prism into the metal mounting. Also the screen tends to shield the plastic strip against accumulating electrical charges which otherwise would adversely affect the electron beam.

What is claimed is:

1. In an electron beam welding device having a vacuum chamber in which an electron gun directs a beam of electrons at a work piece, an optical system for viewing the point of impact of the beam with the work piece comprising a prism, means for supporting the prism in the vacuum chamber to one side of and closely adjacent to the path of the electron beam, the prism having a first surface extending substantially perpendicular to the electron beam, a strip of transparent plastic material having a portion extending across said first surface of the prism, means for moving the strip lengthwise across said prism surface, an open mesh conductive screen positioned adjacent said first surface of the prism for at least partially shielding the prism from infrared radiation, and means conducting static electric charge from the screen and strip, the strip passing between the screen and the prism surface.

2. Apparatus of claim 1 wherein the screen is mounted in conductive relationship to the prism supporting means.

3. Apparatus of claim 2 wherein the transparent strip is a non-conductive plastic material.

4. Apparatus of claim 3 further including means extending outside the chamber for advancing the strip past said prism surface.

5. Apparatus of claim 1 wherein the prism has a second surface substantially parallel to the path of the beam, the prism reflecting light incident on the first surface out through the second surface.

6. An optical system for a high vacuum electron beam welding device, comprising light reflecting means positioned adjacent the electron beam for reflecting light from the impact area of the electron beam along a path extending away from the electron beam, a replaceable strip of transparent non-conductive material positioned between the reflecting means and the impact area of the electron beam, an open mesh metal screen, means supporting the screen between the transparent material and the impact area, the supporting means conducting heat and electrical charge away from the screen, the screen acting as a thermal and electrical shield for the transparent flexible material.

7. Apparatus of claim 6 wherein the replaceable strip is stored in a roll, means mounting the roll adjacent the reflecting means, and means for withdrawing the strip from the roll and moving the strip past the reflecting means.

8. Apparatus of claim 7 wherein the reflecting means is a prism.

* * * * *